(12) United States Patent
Narasimha et al.

(10) Patent No.: US 7,189,644 B2
(45) Date of Patent: Mar. 13, 2007

(54) CMOS DEVICE INTEGRATION FOR LOW EXTERNAL RESISTANCE

(75) Inventors: Shreesh Narasimha, Beacon, NY (US); Patricia A. O'Neil, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/763,308

(22) Filed: Jan. 23, 2004

(65) Prior Publication Data

US 2004/0188766 A1    Sep. 30, 2004

Related U.S. Application Data

(62) Division of application No. 10/249,295, filed on Mar. 28, 2003.

(51) Int. Cl.
   *H01L 21/4763* (2006.01)
   *H01L 29/76* (2006.01)

(52) U.S. Cl. ............. 438/649; 438/592; 257/377; 257/384

(58) Field of Classification Search ........ 257/368, 257/369, 370, 371, 372, 373, 387, 388, 412–413, 257/900, 384, 377, 768–769; 438/199, 200, 438/205, 299, 309, 585, 587, 588, 265, 592, 438/649, 651
   See application file for complete search history.

(56) References Cited

U.S. PATENT DOCUMENTS 4,876,213 A * 10/1989 Pfiester ............... 438/231

| 5,605,865 A | 2/1997 | Maniar et al. |
| 5,710,450 A * | 1/1998 | Chau et al. ............ 257/344 |
| 5,851,866 A * | 12/1998 | Son ..................... 438/231 |
| 5,933,741 A | 8/1999 | Tseng |
| 6,063,681 A * | 5/2000 | Son ..................... 438/303 |
| 6,093,628 A | 7/2000 | Lim et al. |
| 6,187,619 B1 | 2/2001 | Wu |
| 6,187,643 B1 * | 2/2001 | Borland ................ 438/302 |
| 6,198,142 B1 | 3/2001 | Chau et al. |
| 6,207,563 B1 | 3/2001 | Wieczorek et al. |
| 6,211,027 B1 | 4/2001 | Lin et al. |
| 6,242,776 B1 * | 6/2001 | Hause et al. ............ 257/344 |
| 6,313,020 B1 * | 11/2001 | Kim et al. .............. 438/591 |
| 6,319,807 B1 * | 11/2001 | Yeh et al. .............. 438/595 |
| 6,376,351 B1 | 4/2002 | Tsai |
| 6,380,057 B1 | 4/2002 | Buynoski et al. |
| 6,399,452 B1 * | 6/2002 | Krishnan et al. ........ 438/305 |

(Continued)

FOREIGN PATENT DOCUMENTS

WO    WO 02/082503 A2    10/2002

*Primary Examiner*—Ori Nadav
(74) *Attorney, Agent, or Firm*—Scully, Scott, Murphy & Presser, P.C.; Joseph R. Abate, Esq.

(57) ABSTRACT

The present invention relates to a Complementary Metal Oxide Semiconductor (CMOS) device having a lower external resistance and a method for manufacturing the CMOS device. The inventive MOSFET is produced by forming first suicide regions in a substrate as well as atop surface of a gate region and forming second silicide regions where second silicide thickness is greater than the first silicide thickness. The inventive method produces a low resistance first silicide in close proximity to the channel region of the device, where the incorporation of the first silicide decreases the external resistance of the device while the incorporation of the second silicide produces low sheet resistance interconnects.

14 Claims, 7 Drawing Sheets

U.S. PATENT DOCUMENTS

| | | |
|---|---|---|
| 6,432,763 B1 * | 8/2002 | Yu .............................. 438/217 |
| 6,451,679 B1 | 9/2002 | Hu et al. |
| 6,451,701 B1 | 9/2002 | Wang et al. |
| 6,459,106 B2 | 10/2002 | Bryant et al. |
| 6,465,294 B1 | 10/2002 | Tsai et al. |
| 6,465,847 B1 | 10/2002 | Krishnan et al. |
| 6,518,631 B1 * | 2/2003 | En et al. ...................... 257/382 |
| 2002/0137268 A1 | 9/2002 | Pellerin et al. |

* cited by examiner

CMOS DEVICE INTEGRATION FOR LOW EXTERNAL RESISTANCE

CROSS REFERENCE TO RELATED APPLICATION

The present application is a divisional of copending U.S. patent application Ser. No. 10/249,295, filed on Mar. 28, 2003.

BACKGROUND OF THE INVENTION

1. Field of Invention

The present invention relates to semiconductor devices and methods of fabricating semiconductor devices, and more particularly to an improved Complementary Metal Oxide Semiconductor (CMOS) device with a lower external resistance and a method for fabricating the improved CMOS device.

2. Description of the Prior Art

An important property of high performance semiconductor devices is the ability to conduct electricity. Current is inversely related to resistance. Traditionally, increasing the cross-section of the semiconducting material; shortening the length for the electron path; increasing the voltage; or decreasing the resistivity of the semiconducting material can all decrease resistivity and increase electron flow through electrical devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide, semiconductors (CMOS). Scaling achieves compactness and improves operating performance in devices by shrinking the overall dimensions and operating voltages of the device while maintaining the device's electrical properties. Additionally, all dimensions of the device must be scaled simultaneously in order to optimize electrical performance of a device.

One of the primary challenges to MOSFET scaling is lowering the device's external resistance (Rext), also known as source/drain resistance. External resistance is the sum of all of the resistance values in a MOSFET device except for channel resistance. The external resistance is attributed to doping and diffusion of the wafer as well as the silicidation process. When scaling MOSFET devices, and if the device gate-length and the gate oxide thickness are reduced and the external resistance is held constant, then the performance benefits achieved through scaling will be limited.

Figure 1:
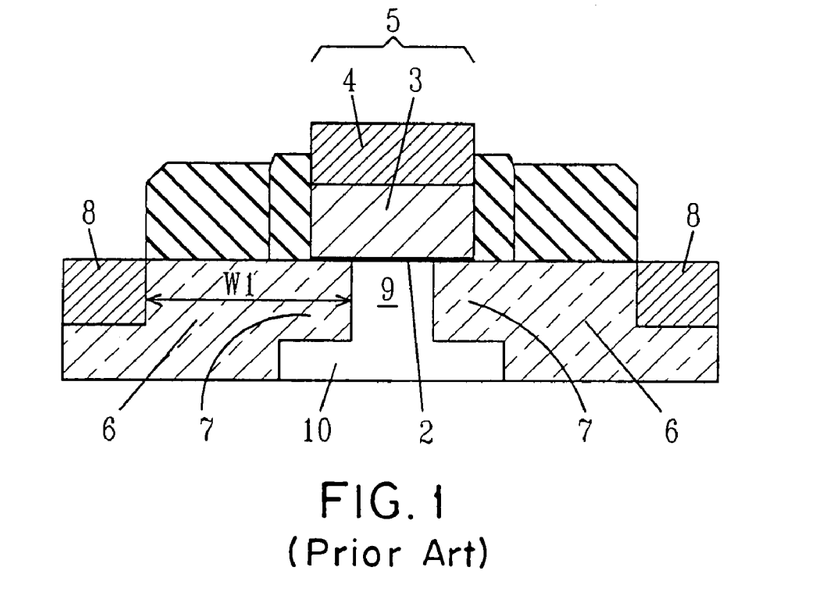
FIG. 1 is a pictorial representation (through a cross-sectional view) showing a conventional MOSFET device incorporating thick silicide regions spaced approximately 60 nm from the channel region.

In conventional MOSFET designs, as depicted in FIG. 1, a gate region 5 is formed atop a Si-containing substrate 10. The gate region 5 includes a gate silicide 4 atop a gate conductor 3, which is positioned atop a gate dielectric 2. The Si-containing substrate 10 includes deep source/drain regions 6, source/drain extensions 7, thick silicide contacts 8, and a channel region 9. The source/drain extensions 7 partially extend under the gate region 5. The electron path W1, through which the current of electron flow to reach the silicide region 8 begins at the end of the source/drain extensions 7 abutting the channel region 9 and extends to the thick silicide region 8. Decreasing the dimensions of the electron path W1 increases the performance of the device. Therefore, it would be desirable to decrease the electron path W1 by decreasing the distance between the silicide region and the end of the source/drain extension regions 7 abutting the channel region 9.

Utilizing current MOSFET designs, the electron path W1, i.e., path of current through the source/drain extension region 7 prior to reaching the low-resistance thick silicide 8, is on the order of 60 nm. In conventional MOSFET designs, the thick silicide 8 cannot be brought closer to the channel for the following reasons:

First, conventional MOSFET designs utilize thick silicide layers for reducing the sheet resistance between the devices incorporated in the chip's design. The thicker the silicide, the greater the cross-section of the interconnect, resulting in a low resistance/high current interconnect. Thick silicides form into the substrate in both horizontal and vertical directions during anneal processing steps and therefore must have appropriate spacing away from the extension edge at the channel-end tip and the extension edge at the bottom of the junction.

For example, when utilizing cobalt for silicidation, a 5–10 nm deposited Co layer will diffuse to a depth of approximately 20–40 nm and will also diffuse laterally. Thick silicide regions can give rise to a substantial degree of interface roughness, which can lead to punch-through of the thin extension junctions. Punch-through can lead to excessive level of junction leakage. The above limit on how close a silicide may be brought to the channel without statistical failure or penalty in yield is a fundamental integration constraint for the conventional MOSFET.

Second, in order to bring the silicide closer to the channel region 9, the final spacer width must be reduced, decreasing the distance between the deep source/drain regions 6 and the channel region 9. Decreasing the proximity between the deep source/drain regions 6 and the channel region 9 increases the interaction between the deep source/drain regions 6 and the channel region 9 resulting in increased short channel effects. Short channel effects are well known to those skilled in the art as a decrease in threshold voltage, Vt, due to electrical charge sharing between the gate and the source drain regions, resulting in degradation of the devices ability to control whether the device is on or off.

It would be desirable to provide a MOSFET device that has a minimized external resistance.

SUMMARY OF THE INVENTION

The present invention provides a MOSFET device that has a low external resistance and a method for producing such a low external resistance MOSFET device. Conventional device designs have an external resistance on the order of 200–300 ohm-micron for NFET devices. The inventive MOSFET has a low external resistance that is about 10% to 50% less than conventional designs. The inventive MOSFET device also incorporates low sheet resistance interconnects. In high performance chip designs, it is desirable to produce low external resistance devices incorporating low resistance contacts for interconnects between the devices incorporated within the chip. The inventive MOSFET device achieves a low external resistance through the application of a first and second silicide region where the first silicide region is of a lesser thickness than the second silicide region and is in close proximity to the channel region of the device. First silicide regions are thinner than conventional silicide regions and therefore avoid the disadvantages inherent in spacing conventional silicides in close proximity to the channel region. Second silicide regions have a greater thickness than first silicide regions and provide low sheet resistance interconnects for the devices incorporated within the chip.

The first silicide region, can be brought to within about 2 nm to about 15 nm of the source/drain extension tip at the channel end. This is much closer than the distance used in conventional MOSFET designs, which is on the order of approximately 60 nm. The first silicide region is of a lower resistance than the source/drain extension regions. By incorporating the first silicide into the source/drain extension region, the external resistance of the device of the present invention is reduced by the difference between the resistance of the source/drain extension region and the first silicide region.

In broad terms, the method of the present invention comprises the steps of:

forming a gate region atop a surface of a substrate;

forming first spacers with a first spacer width on sidewalls of the gate region;

forming first silicide regions having a first silicide thickness in the substrate as well as atop an exposed surface of the gate region;.

forming second spacers with a second width greater than the first spacer width on the substrate, wherein second spacers protect the first silicide region in the substrate; and forming second silicide regions in said substrate and atop said surface of the gate region, where the second silicide has a thickness that is greater than the first silicide thickness.

One embodiment of the present invention is directed to a method for producing a low resistance N-type doped Field Effect Transistor (NFET) device. Doping a Si-containing substrate with a group V element of the Periodic Table of Elements typically produces an NFET device. When producing a low resistance NFET device incorporating first silicide regions, predoping of the gate can be implemented. Following gate pre-doping, a second implant forms source/drain extension regions. Finally, deep source/drain regions are formed using a further implant.

A second embodiment of the present invention is directed to a method for producing a low resistance P-type doped field effect transistor (PFET) device. PFET devices are typically produced within Si-containing substrates by doping the substrate with a group III-A element of the Periodic Table of Elements. In addition to producing low resistance PFET devices incorporating first silicide regions using one implant for the source/drain extensions and a second implant for the deep/source drain regions, it is possible to produce both the source/drain extensions and the deep source/drain regions using a single implant.

Another aspect of the present invention relates to a low resistance MOSFET produced using the method of the present invention. In broad terms, the inventive low resistance MOSFET comprises:

a substrate comprising a first silicide region with a first silicide thickness and abutting a second silicide region with a second silicide thickness, wherein the second silicide thickness is greater than the first silicide thickness;

a patterned gate region atop the substrate;

first spacers abutting sidewalls of said pattern gate region having a first spacer width; and second spacers abutting sidewalls of the first spacers, said second spacers having a second spacer width greater than the first spacer width, wherein the second spacers are positioned atop and are self-aligned to said first silicide region.

BRIEF DESCRIPTION OF THE DRAWINGS

FIG. 3($a$)–($h$) are pictorial representations (through a cross-sectional views) showing the basic processing steps that are employed in one embodiment of the present invention. In the illustrated embodiment, a NFET device incorporating a thin silicide region in close proximity to the channel region is produced.

FIG. 4($a$)–($g$) are pictorial representations (through cross-sectional views) showing the basic processing steps that are employed in another embodiment of the present invention. In the illustrated embodiment, a PFET device incorporating a thin silicide region in close proximity to the channel region is produced.

DETAILED DESCRIPTION OF THE INVENTION

The present invention, which provides a method of fabricating a low external resistance MOSFET device as well as the MOSFET structure formed by the inventive method, will now be described in more detail by referring to the drawings that accompany the present application. It is noted that in the accompanying drawings, like reference numerals are used for describing like and corresponding elements.

Figure 2:
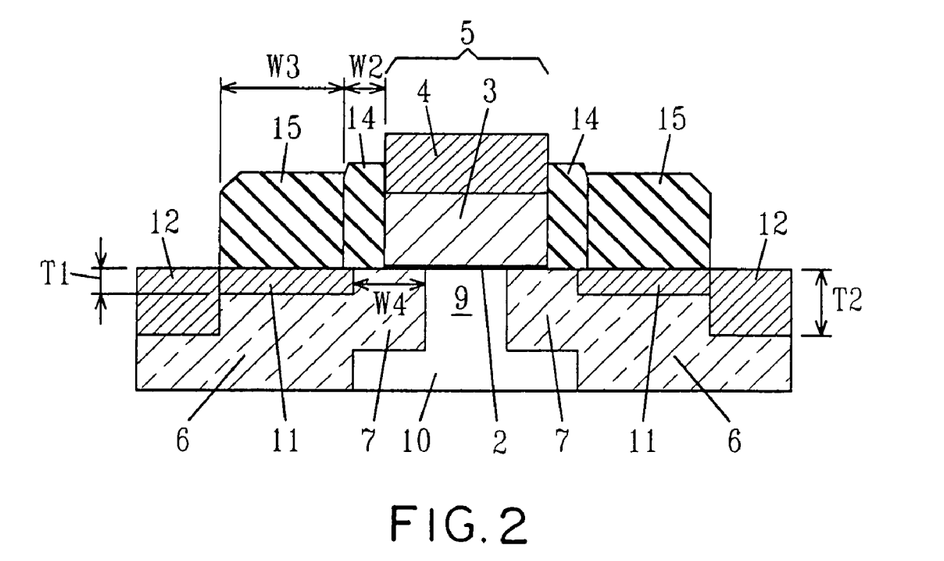
FIG. 2 is a pictorial representation (through a cross-sectional view) of the inventive MOSFET device incorporating a thin silicide region in close proximity to the channel region.

Reference is first made to FIG. 2, which depicts the MOSFET device of the present invention. The inventive MOSFET device, includes a first silicide region 11 having a first silicide thickness T1, and a second silicide region 12 having a second silicide thickness T2, where the second silicide thickness T2 is greater than the first silicide thickness T1. The inventive MOSFET device also includes a gate region 5 positioned atop a substrate 10. The gate region 5 includes a gate dielectric 2; a gate conductor 3 having sidewalls protected by an oxide layer (not specifically labeled) positioned atop the gate dielectric 2; and a gate silicide 4 positioned atop the gate conductor 3. The substrate 10 includes deep source/drain regions 6, source/drain extensions 7, first silicide regions 11 and second silicide regions 12. First spacers 14, having a first spacer width W2, abut the gate region 5. Second spacers 15, having a second spacer width W3 greater than first spacer width W2, are formed atop and self-aligned to the first silicide regions 11 as well as abutting first spacers 14.

Second silicide regions 12 function as low resistivity contacts incorporated into chip designs requiring low sheet resistance interconnects. The first silicide regions 11 allow for low resistivity silicide to be positioned closer to the channel region 9 of the device. By incorporating first silicide regions 11, the electron path W4 through which current flows before reaching low resistivity silicide can be reduced to less than about 20 nm, more preferably less than about 5 nm.

Another aspect of the present invention includes the method for producing the inventive MOSFET device incorporating first and second silicide regions. Reference is made to the embodiment shown in FIGS. 3($a$)–3($h$). In the present invention, a low external resistance NFET is produced by incorporating a first silicide region 11, having a thickness of the order of about 2 nm to about 15 nm, in close proximity to the channel region 9 of the device.

Figure 3A:
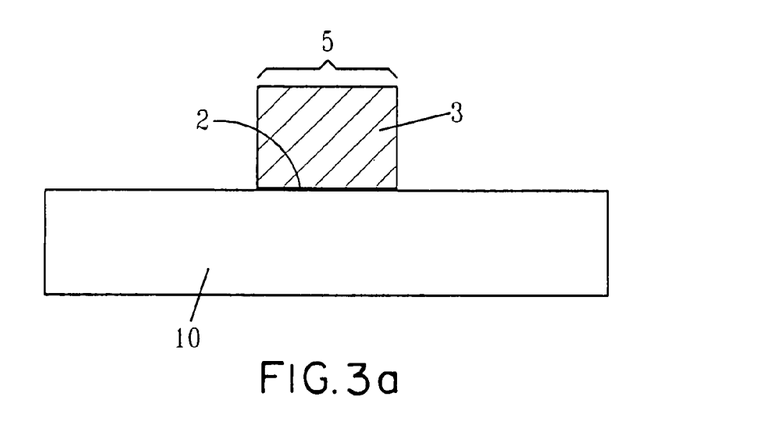

Referring to FIG. 3(a), a patterned gate region 5 is formed atop a substrate 10 utilizing conventional methods including deposition and lithography. The pattern gate region 5 includes a gate conductor 3 positioned atop a gate dielectric 2. The substrate 10 includes, but is not limited to: any semiconducting material such conventional Si-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures. Layered semiconductors such as Si/Ge are also contemplated herein.

The gate dielectric 2, formed atop the substrate 10, is typically an oxide material and is generally greater than 0.8 nm thick, and preferably about 1.0 nm to about 1.2 nm thick. The gate dielectric 2 may also be composed of a nitride, oxynitride, or combination thereof, with and without the oxide material. The gate dielectric 2 is formed using conventional techniques such as chemical vapor deposition (CVD), atomic layer CVD (ALCVD), pulsed CVD, plasma assisted CVD, sputtering, and chemical solution deposition, or alternatively, the gate dielectric 2 is formed by a thermal growing process, which may include oxidation, oxynitridation, nitridation, and/or plasma or radical treatment. Suitable examples of oxides that can be employed as the gate dielectric 2 include, but are not limited to: $SiO_2$, $Al_2O_3$, $ZrO_2$, $HfO_2$, $Ta_2O_3$, $TiO_2$, perovskite-type oxides and combinations and multi-layers thereof. The gate dielectric 2 can be in either amorphous, polycrystalline, or epitaxial form.

The gate conductor 3 can be comprised of polysilicon or an appropriate metal. The gate conductor 3 is formed atop the gate dielectric 2 utilizing a conventional deposition process such as CVD and sputtering.

After forming gate dielectric 2 and gate conductor 3, the patterned gate region 5 is formed utilizing conventional photolithography and etching. Specifically, a pattern is produced by applying a photoresist to the surface to be patterned; exposing the photoresist to a pattern of radiation; and then developing the pattern into the photoresist utilizing a conventional resist developer. Once the patterning of the photoresist is completed, the sections covered by the photoresist are protected, while the exposed regions are removed using a selective etching process that removes the unprotected regions. Following the formation of the patterned gate region 5, a protection oxide layer is formed about and protecting the patterned gate region 5. The protection oxide layer is produced by thermal oxidation of the gate region 5.

A pre-doping of the gate conductor 3 may be performed at this point of the present invention. Predoping of the gate conductor allows for the utilization of elements with high diffusion rates, while avoiding diffusion of the implanted elements from the source/drain regions 6 into the channel region 9 of the device that increase the incidence of short channel effects. When producing a NFET device, phosphorus predoping of the gate conductor 3 is preferred; for its high diffusion rate, but must be implemented in a pre-dope of only the gate region 5 in order to avoid channel effects within the substrate 10. Pre-doping is utilized to avoid applying the heavy dose/fast diffusing species required in the gate region 9 from being applied to the source/drain region 6 where it will encroach into the channel region 9 and produce a short channel effect. The pre-dope may be conducted during deposition of the gate conductor material prior to patterning and etch; after etching of the gate conductor 3; or in-situ. A typical gate implant dose range is from about $5 \times 10^{15}$ atoms/cm$^2$ to about $2 \times 10^{16}$ atoms/cm$^2$, with an optimal dose of about $8 \times 10^{15}$ atoms/cm . The implant energy is kept substantially low to prevent penetration of implanted species into the substrate 10. If the protection oxide layer is present, the implant energy should be substantially large to allow for ion penetration into the gate conductor 3. A typical implant energy range is from about 1 to about 20 keV, with an optimal energy of approximately 12 keV. Implant dopants may be type III-A elements or a type V elements. Implant energies depend on the species being implanted, the above described implant energies are most suitable for phosphorous.

An optional block-mask can be used prior to implantation to pre-select the substrate area for gate conductor doping with one dopant type. The block-mask application and implantation procedure can be repeated to dope selected gate conductors with different dopant types.

Figure 3B:
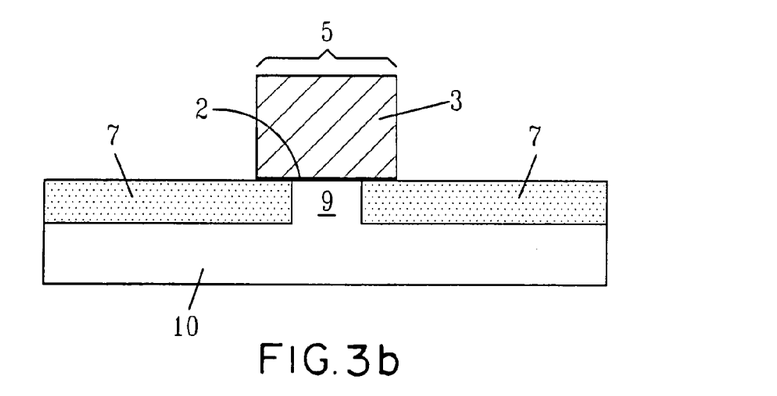

Referring to FIG. 3(b), source/drain extension regions 7 are formed in substrate 10 and partially extend under the gate region 5. Source/drain extension regions 7 are formed via ion implantation and comprise a combination of normally incident and angled implants to form the desired grading in the extensions. For producing NFET devices arsenic, as opposed to phosphorus, is preferred in order to avoid short channel-effect degradation caused by source/drain encroachment into the channel region that occurs when utilizing implant elements with a high rate of diffusion. Although arsenic implants are preferred, other group V elements utilized to form NFET devices may be incorporated into the inventive method, also including phosphorus and antimony. Implant energies for forming source/drain extension regions 7 are typically: from about 1 keV to about 5 keV, preferably about 3 keV, for arsenic; from about 1 keV to about 7 keV, preferably about 4 keV, for $BF_2$; and from about 1 keV to about 2 keV, preferably about 1 keV, for boron. These implants are typically carried out using a low concentration of dopant dose on the order of $5 \times 10^{14}$ atoms/cm$^2$–$2 \times 10^{15}$ atoms/cm$^2$, preferably about $1 \times 10^{15}$ atoms/cm$^2$.

Figure 3C:
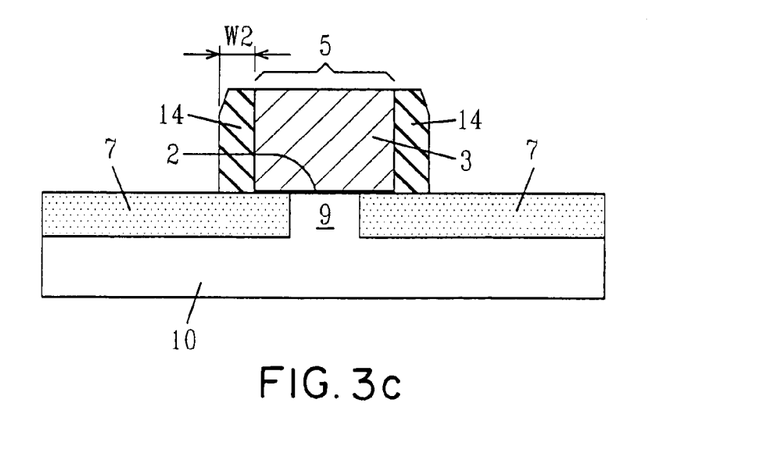

Following source/drain extension region 7 implants, first spacers 14 are formed abutting the gate region 5 as depicted in FIG. 3(c). First spacers 14 are formed using conventional deposition and etch processes that are well known in the art. First spacers 14 have a first spacer width W2 of preferably from about 3 nm to about 40 nm; more preferably about 5.0 nm to about 20.0 nm; even more preferably from about 7.0 nm to about 15.0 nm; and most preferably about 10 nm. First spacer width W2 is less than second spacer width W3. First spacer 14 may be comprised of a dielectric material such as a nitride. The first spacer 14 materials most preferably comprise SiN.

Figure 3D:
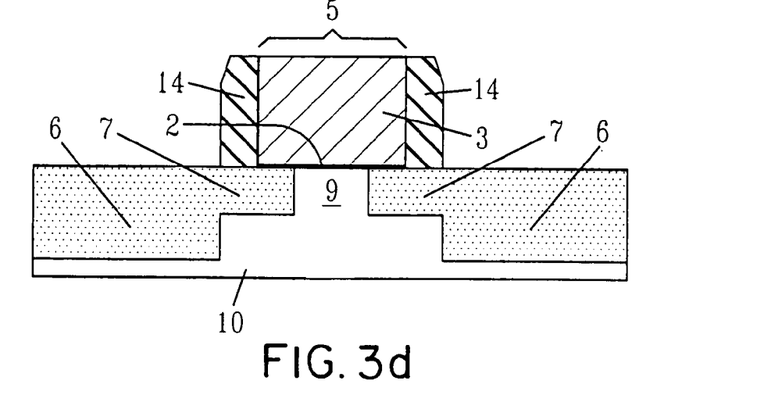

Referring to FIG. 3(d), following first spacer 14 formation, a higher energy ion implant is conducted to form deep source/drain regions 6. These implants are typically carried out using a high concentration of dopant dose on the order of about $1 \times 10^{15}$ atoms/cm$^2$ to about $5 \times 10^5$ atoms/cm$^2$, preferably about $3 \times 10^{15}$ atoms/cm$^2$Implant energy is dependent on implant species and substrate; i.e., arsenic implant of a SOI CMOS substrate typically requires an implant from about 10 keV to about 20 keV. Deep source/drain regions 6 are preferably formed using a group V dopant implant, preferably arsenic because it diffuses into the substrate slowly. Group IIIA elements may also be utilized as the implant for deep source/drain 6 formation.

Figure 3E:
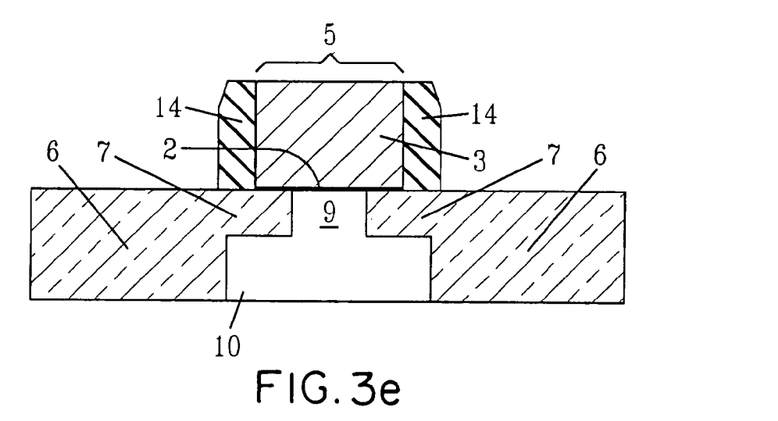

Following deep source/drain region 6 formation, the source/drain and gate regions are activated by activation annealing using conventional processes such as, but not limited to: rapid thermal annealing, furnace annealing or flashlamp annealing. Activation anneal is conducted at a temperature above 850° C. with an optimal temperature of about 1000° C. This step of the present invention activates the dopant atoms, which changes the conductivity of the Si-containing material to which the dopants were implanted. The resultant structure produced during activation anneal is depicted in FIG. 3(e).

Figure 3F:
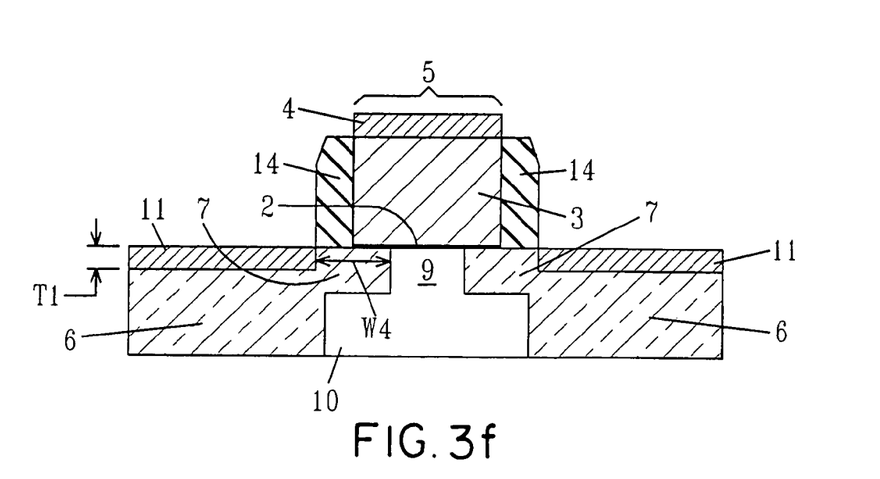

Following activation anneal, the inventive first silicide region 11 is formed as depicted in FIG. 3(f). Silicide formation typically requires depositing a metal layer onto the surface of a Si-containing material or wafer. The metal layer may be formed using a conventional process including, but not limited to: chemical vapor deposition (CVD), plasma-assisted CVD, high-density chemical vapor deposition (HDCVD), plating, sputtering, evaporation and chemical solution deposition. Metals deposited for silicide formation include Ta, Ti, W, Pt, Co, Ni, and combinations thereof, most preferably Co. Following deposition, the structure is then subjected to an annealing step using conventional processes such as, but not limited to: rapid thermal annealing. During thermal annealing, the deposited metal reacts with Si forming a metal silicide. Metal is deposited onto exposed portions of source/drain extension regions 7 to form a metal layer with a thickness from about 2 nm to about 7 nm, preferably about 2 nm. Depositing a 2 nm thick layer of Co atop a Si-containing material forms a thin silicide layer 11 having a thickness of about 7 nm. Metal is also deposited atop the gate conductor 3 and forms a gate silicide region 4.

First silicide region 11 has a first silicide thickness T1 of about 1 nm to about 20 nm, preferably from about 2.0 nm to about 15 nm, even more preferably from about 5.0 nm to about 12.0 nm, and most preferably from about 7.0 nm to about 10.0 nm. Second silicide thickness T2 is greater than first silicide thickness T1. The end of the first silicide region 11 closest to the channel region 9 of the device is spaced, W4, about 2 nm to about 15 nm, preferably about 3 nm to about 10 nm, most preferably about 7 nm, from the end of the source/drain extension regions 7 abutting the channel region 9. The introduction of the low resistance first silicide region 11 into the source/drain extension region 7 in closer proximity to the channel region 9 than previously possible decreases the external resistance of the device.

Figure 3G:
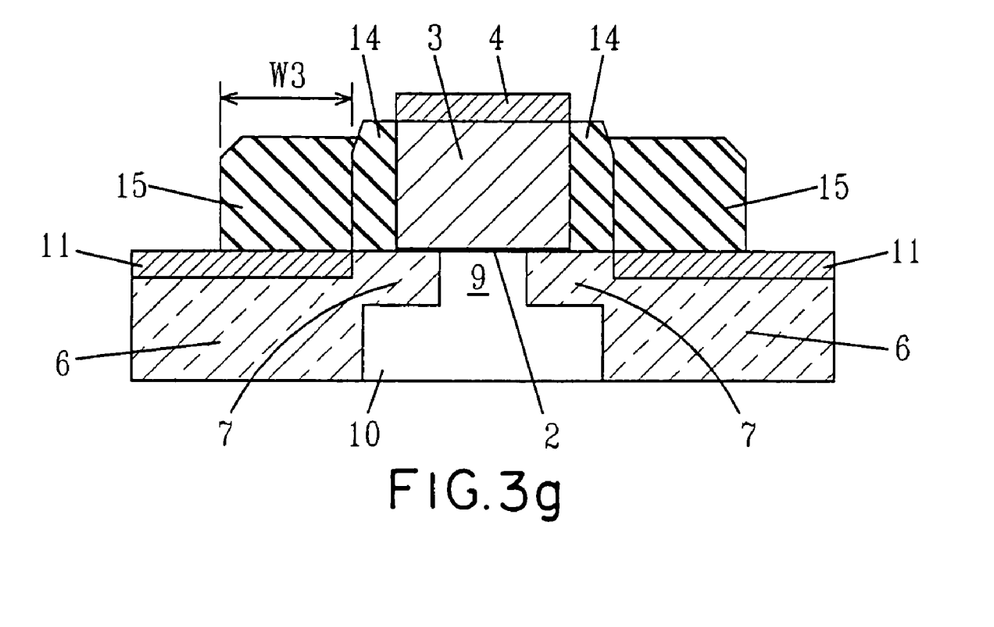

Referring to FIG. 3(g), second spacers 15 are formed atop thin silicide region and abutting first spacers 14. Second spacers 15 are formed using conventional deposition and etching processes that are well known in the art and have a second spacer width W3 from about 20 nm to about 90 nm, preferably from about 30 nm to about 70 nm, even more preferably from about 40 nm to about 60 nm, and most preferably 50 nm. Second spacer width W3 is greater than first spacer width W2. Second spacer 15 may be comprised of a dielectric material such as a nitride, oxide, oxynitride, or a combination thereof. Second spacer 15 materials most preferably comprise SiN.

Figure 3H:
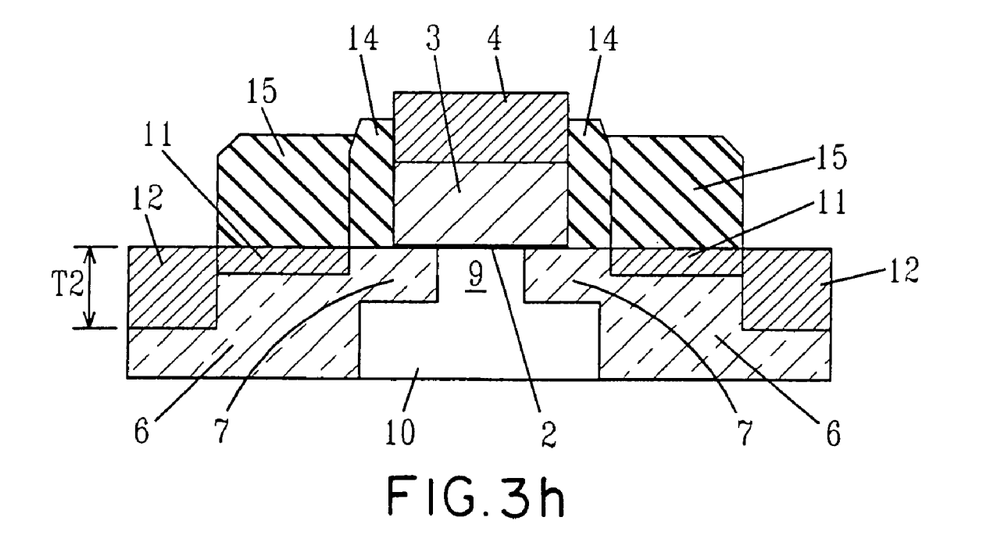

Following second spacer 15 formation, second silicide regions having second silicide thickness T2 are formed as depicted in FIG. 3(h). Second silicide regions 12 are thicker, having a greater depth dimension from the surface of the substrate T2, than first silicide region 11. Second silicide 12 formation requires that further metal be deposited atop exposed silicide regions not protected by first and second spacers 14, 15. First silicide region 11 is self-aligned to and protected from further metal deposition by second spacers 15. Metals deposited for second silicide 12 formation include Ta, Ti, W, Pt, Co, Ni, and combinations thereof, most preferably Co. The metal layer formed after second deposition has a thickness ranging from about 6 nm to about 10 nm.

Following deposition, the structure is then subjected to an annealing step, at a temperature of about 400° C. to about 850° C. using conventional processes such as, but not limited to: rapid thermal annealing. The anneal process for silicide formation is dependent on the metal utilized; i.e., for Co the first temperature for monosilicide formation is about 500° C., while the second temperature for disilicide formation is about 750° C. Following anneal, the resulting thickness T2 of the second silicide region 12 is from about 10 nm to about 40 nm thick, preferably from about 15 nm to about 35 nm thick, more preferably from about 20 nm to about 35 nm thick, even more preferably from about 20 nm to about 30 nm thick; and most preferably about 20 nm thick. The resultant NFET comprises a second silicide region 12 and a first silicide region 11; where the first silicide region 11 decreases the external resistance of the device and the second silicide region 12 serves as a low resistance interconnect.

Optionally, a second anneal may be conducted in order to produce a lower resistivity phase of the first and second silicide regions 11, 12. For example, when utilizing Ti suicides ($TiSi_2$), the C49 phase of $TiSi_2$ forms at an anneal temperature of approximately 600° C. to 625° C. and has a resistivity of approximately 60 to 65 micro-ohms-cm, while the C54 phase, produced after a second anneal of about 800° C. or greater, has a much lower resistivity of about 10 to about 15 micro-ohms-cm.

A second embodiment of the present invention is a method for producing a low resistance PFET as depicted in FIGS. 4(a)–4(g). It is possible to integrate PFET production in a manner analogous to the NFET, with the exception of changing the doping materials from group V elements to group III-A elements. Alternatively, a second embodiment of the inventive method produces low resistance PFET devices utilizing a single implant to form both source/drain extensions and deep source/drain regions. Utilizing a single implant to produce both the source/drain extension and the deep source/drain regions substantially reduces encroachment of the implant elements upon the channel and the likelihood of short channel effects.

Figure 4A:
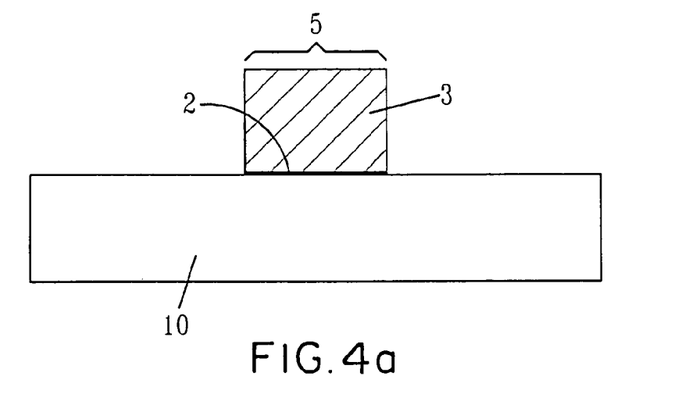
Figure 4B:
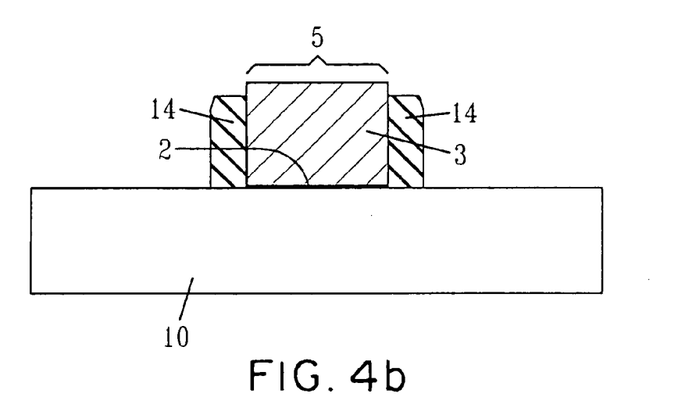

Referring to FIGS. 4(a)–(b), to produce PFET devices incorporating the inventive first silicide 11, an implant to pre-dope the gate conductor 3 and only a single implant to form source/drain regions is performed. All other process steps relating to gate region 5 formation and spacer 14, 15 formation for PFET devices are the same or similar to the process steps for developing NFET devices incorporating the inventive first silicide 11, as discussed above.

Figure 4C:
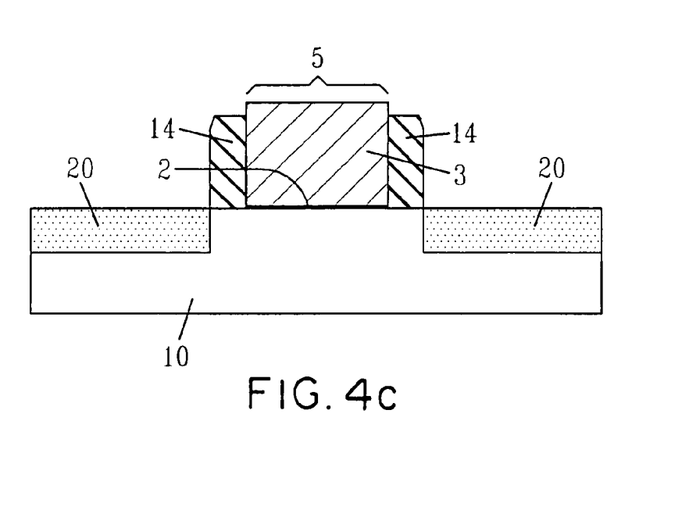
Figure 4D:
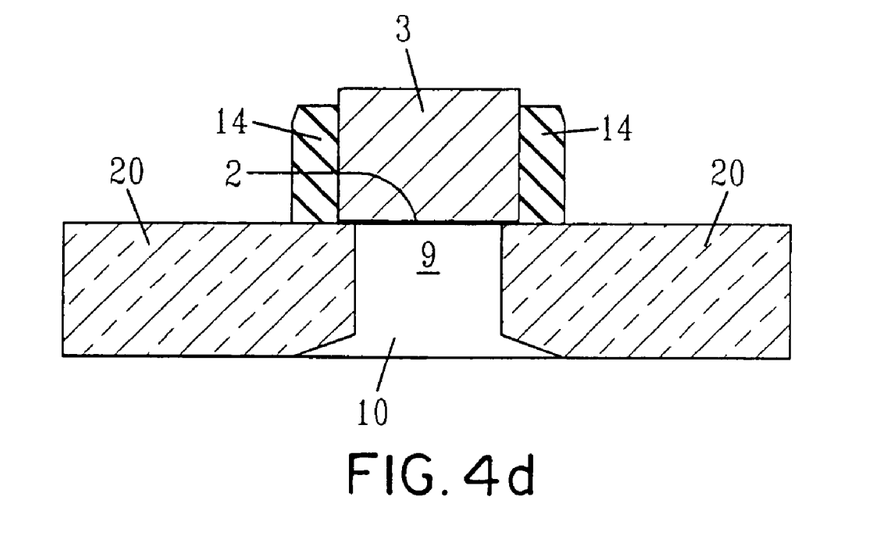

Referring to FIGS. 4(c)–(d), a single low energy implant is introduced via ion implantation to form a dopant region 20 including deep source/drain regions and shallow source/drain extensions. Implant energies for fanning the dopant region 20 include ranges similar for forming source/drain regions 7; typical ranges are from about 1 keV to about 5 keV, preferably about 3 keV, for arsenic; from about 1 keV to about 7 keV, preferably about 4 keV, for $BF_2$; and from 1 keV to about 2 keV, preferably about 1 keV, for boron. Following the single low energy implant, an activation anneal is conducted at approximately 850° C. more preferably at about 1000° C. as depicted in FIG. 3(d). Although boron is preferred, other types of Group III elements may be utilized for producing PFET devices.

Figure 4E:
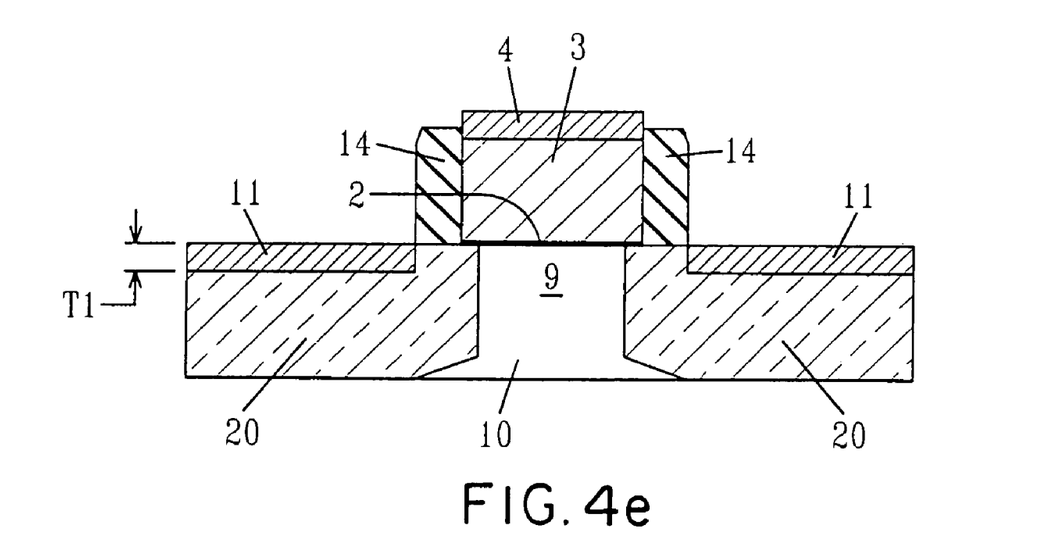

Referring to FIG. 4(e), the inventive first silicide 11 regions are formed, as described in the above method for producing NFET devices. First silicide regions 11 have a thickness T1 of about 5 nm to about 15 nm and allow for the silicide region to be brought within 2 nm to about 15 nm, preferably about 7 nm, of the end of the shallow source/drain extension 20 abutting the channel region 9 of the device.

Figure 4F:
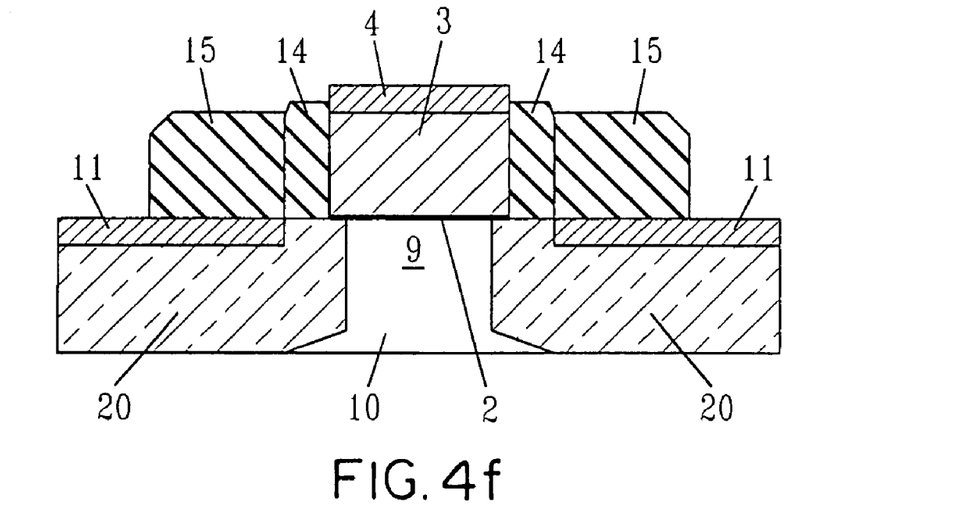
Figure 4G:
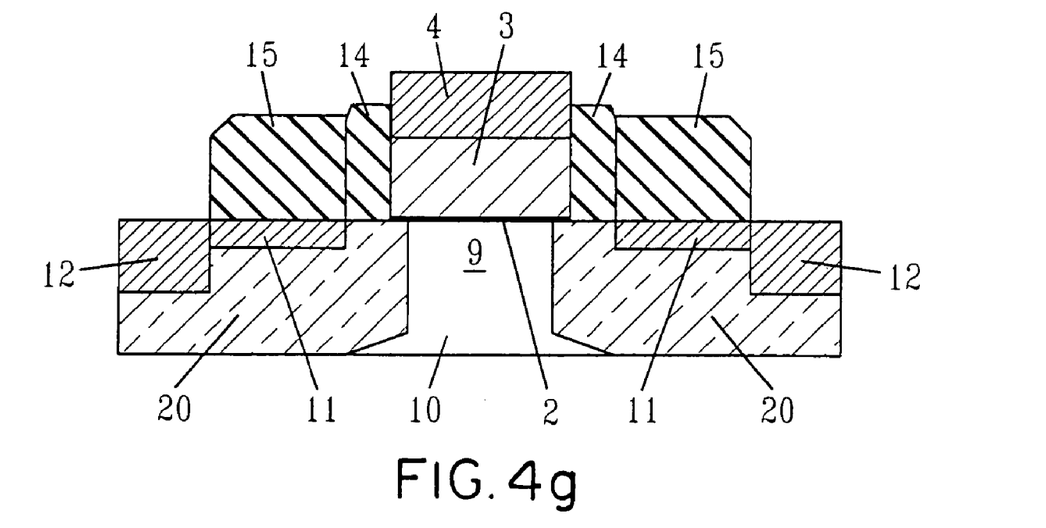

Referring to FIGS. 4(f)–(g), following first silicide formation 11, second spacers 15 are formed atop first silicide 11 regions and second silicide 12 region formed following the same or similar process steps as described above for producing NFET devices. The resultant PFET comprises a second silicide region 12 and a first silicide region 11; where the first silicide region 11 decreases the external resistance of the device and the second silicide region 12 serves as a low resistance interconnect.

While the present invention has been particularly shown and described with respect to preferred embodiments thereof, it will be understood by those skilled in the art that the foregoing and other changes in forms and details may be made without departing from the spirit and scope of the present invention. :It is therefore intended that the present invention not be limited to the exact forms and details described and illustrated, but fall within the scope of the appended claims.

Having thus described the invention in detail, what we claim is new, and desire to secure by Letters Patent is:

1. A method for forming a low resistance MOSFET device comprising:
    forming a gate region atop a surface of a substrate;
    subsequently, forming source and drain extension regions in the substrate, wherein a channel region is formed between said source and drain extension regions in the substrate;
    subsequently, forming first spacers each having a first spacer width on sidewalls of said gate region;
    subsequently, forming source and drain regions in the substrate abutting the source and drain extension regions, respectively;
    subsequently, forming first silicide regions each having a first vertical silicide thickness in said substrate, wherein the first vertical silicide thickness from about 2 to about 15 nm;
    subsequently, forming second spacers atop said substrate each having a second spacer width along sidewalls of the first spacers, wherein said second spacers protect said first silicide regions in said substrate; and
    subsequently, forming second silicide regions in said substrate, wherein said second silicide regions each have a second vertical silicide thickness that is greater than said first vertical silicide thickness.

2. The method of claim 1 wherein said forming of said gate region further comprises predoping of said gate region.

3. The method of claim 2 wherein said predoping is performed by ion implantation of a type III-A element or a type V element into said gate region.

4. The method of claim 3 where predoping is achieved via ion implantation of phosphorus into said gate region.

5. The method of claim 1 wherein said first spacer width is from about 5 nm to about 20 nm.

6. The method of claim 1 wherein said first spacer width is from about 7 nm to abut 15 nm.

7. The method of claim 1 wherein said second spacers width is from about 20 nm to about 90 nm.

8. The method of claim 1 wherein said second spacers width is from about 30 nm to about 70 nm.

9. The method of claim 1 wherein said forming of said first silicide region comprises depositing a first metal layer upon an exposed surface of said substrate and annealing.

10. The method of claim 9 where said first metal layer has a thickness from about 2 nm to about 7 nm.

11. The method of claim 10 where said first metal layer comprises Ta, Ti, W, Pt, Co, Ni, or combinations thereof.

12. The method of claim 1 wherein said first vertical silicide thickness is from about 5 nm to about 12 nm.

13. The method of claim 1, where the distance between said first silicide region and said channel region is from about 2 nm to about 15 nm.

14. The method of claim 1, where the distance between said first silicide region and said channel region is from about 3 nm to about 10 nm.

* * * * *